March 31, 1959 D. J. CARLSON 2,880,282
U. H. F.-V. H. F. R. F. AMPLIFIER FOR USE IN TUNERS
Filed Dec. 1, 1954
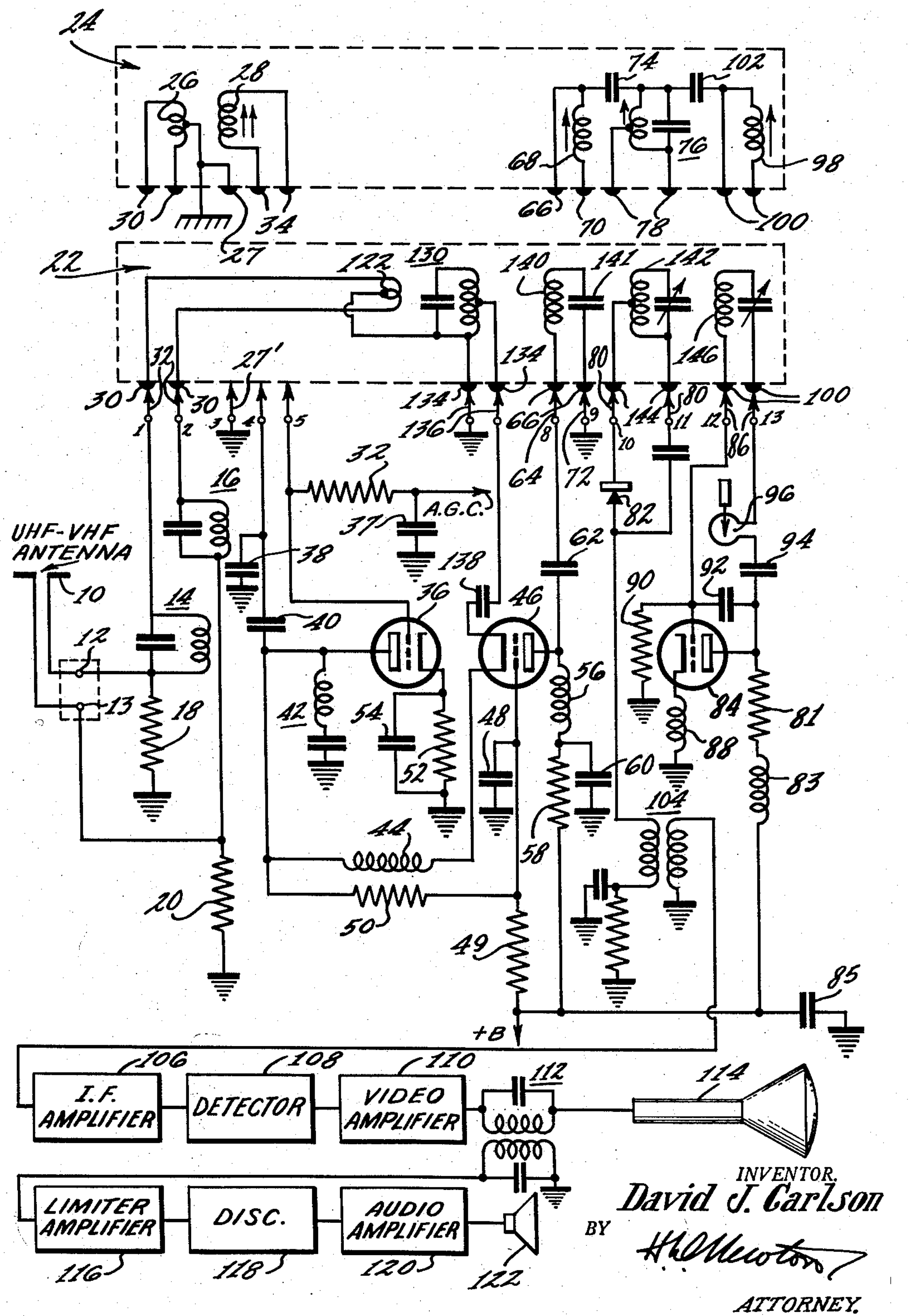
INVENTOR.
David J. Carlson
BY
ATTORNEY.

2,880,282

U.H.F.-V.H.F. R.F. AMPLIFIER FOR USE IN TUNERS

David J. Carlson, Haddon Heights, N.J., assignor to Radio Corporation of America, a corporation of Delaware Application December 1, 1954, Serial No. 472,459

5 Claims. (Cl. 179—171)

The invention relations to high frequency signal amplifiers and more particularly relates to high frequency amplifying systems for television receivers and the like which are adapted to provide efficient amplification of both very high frequency (VHF) and ultra high frequency (UHF) television signals.

Most television receivers currently being marketed utilize a driven grounded grid amplifier for providing radio frequency amplification of received VHF signals. The driven grounded grid amplifier is a well-known type of radio frequency R.F. amplifier which comprises a triode grounded cathode stage driving a triode grounded grid stage. This amplifier provides the low noise characteristics of a triode while obtaining amplification comparable to that of a pentode.

The received VHF television signals are fed to the grid of the grounded cathode stage and the amplified output signals are extracted from the anode circuit of the grounded grid stage. The R.F. amplification of the VHF signals improves the overall performance of the receiver by reducing the noise factor. This is because the major source of noise is in the signal mixer stage, and the R.F. amplification of the received television signals in the low noise R.F. amplifier masks the noise generated by the mixer.

Many television receivers are adapted for UHF reception as well as the VHF reception. In general it is found that UHF operation is inferior to that of VHF operation. One reason for this is that R.F. amplification is not provided for the received UHF signals, and a large amount of noise generated in the UHF mixer stage is fed through to the television signal channel. It is recognized that UHF signals are amplified most efficiently in grounded grid amplifiers, and that it is difficult to obtain good performance in grounded cathode amplifiers or driven grounded grid amplifiers. Furthermore, the tubes used for VHF amplification are unstable at UHF. Thus in order to secure the advantages of driven grounded grid operation for VHF signals and also to provide amplification at UHF, it is necessary to provide a separate UHF amplifier which requires additional expensive tubes.

Accordingly it is an object of this invention to provide improved R.F. amplifier for both VHF and UHF television signals which secures the advantages of driven grounded grid operation for the amplification of VHF signals and provides grounded grid operation for UHF signals.

It is another object of this invention to provide an improved and efficient R.F. amplifier for television receivers which provides amplification of both VHF and UHF signals without additional tubes or circuitry than ordinarily is used for VHF amplification alone.

In accordance with one embodiment of the invention, a conventional driven grounded grid amplifier which includes a grounded cathode stage driving a grounded grid stage is used for the amplification of both UHF and VHF television signals. The VHF signals are applied to the grid of the grounded cathode stage, and the UHF signals are applied to the cathode of the grounded grid stage. The tube used in the grounded grid stage should be selected as one which is known to perform satisfactorily at ultra high frequencies. The only additional circuitry which need be added for UHF amplification, is the UHF input connection to the cathode of the grounded grid amplifier. Hence, the amplifier may function either as a driven grounded grid amplifier for VHF or as a grounded grid amplifier for UHF without additional tubes or circuitry. An automatic gain control potential which is derived in the signal channel of the signal receiver and has a magnitude which is a function of the input signal strength may be applied to the grid of the grounded cathode stage and operates as a variable gain control for the R.F. amplifier on both VHF and UHF reception.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

The sole figure is a schematic circuit diagram of a television receiver including a radio frequency amplifier embodying the invention. A UHF-VHF antenna 10, representing any conventional signal pickup means, is provided for receiving VHF and UHF television signals. A conventional twin conductor transmission line having good performance characteristics through the VHF and UHF bands and having a characteristic impedance to match the antenna is connected between the antenna 10 and a pair of antenna input terminals 12 and 13 to conduct received signals from the antenna to the receiver input circuits.

The terminals 12 and 13 are connected to the receiver input circuits through a pair of intermediate frequency (I.F.) trap circuits 14 and 16 to remove any signals of the I.F. which would otherwise be fed into the receiver signal channel and cause interference. A pair of resistors 18 and 20 are connected from the input terminals 12 and 13 respectively to ground for reasons of static drain.

A tuning circuit strip 24 for a television receiver, such as might be used to select a predetermined VHF television channel is adapted for placement in a turret tuner. Ordinarily one circuit strip is provided for each of the twelve channels in the VHF television band and one or more strips for selected VHF channels. In most turret tuners, the circuit strips are longitudinally positioned about the periphery of a drum or turret member which is rotatable with respect to the tuner chassis. Connection from the circuit strips to the television receiver circuits is made through a plurality of contact buttons on the circuit strips and stationary cooperating contact elements mounted on the tuner chassis. Predetermined ones of the circuit strips may be connected with the receiver by rotation of the turret member to bring the contact buttons on the desired circuit strip into contact with the stationary contact elements. Although the radio frequency amplifier of the invention is described in connection with a turret tuner, it should be understood that the specific tuning devices or structures per se form no part of the invention and are illustrated and described to enable a more complete understanding of this invention. By way of example, the amplification system may also be used with television receivers or the like employing step by step VHF tuners and continuous UHF tuners, or alternatively where both the UHF and VHF tuners are continuously tuned.

The circuit strip 24 has an insulating supporting panel on which is mounted components for conditioning the television receiver to receive a predetermined channel.

A tapped input winding 26 on the supporting panel is connected with a pair of contact buttons 30. The tap on the winding 26 is connected with the conductive frame of the rotatable turret to provide a ground return for the balanced input circuit. The rotatable turret frame is maintained at system ground by a connection through the contact button 27 on the circuit strip and the stationary contact element 27' to the tuner chassis. Signals intercepted by the antenna 10 are conveyed to the input winding 26 through the stationary contact elements 32 and the contact buttons 30.

A secondary winding 28 which is inductively coupled to the winding 26, is connected through a pair of contact buttons 34 on the circuit strip, to the input circuit of a driven grounded grid radio frequency (R.F.) amplifier which has a driver stage including an electron discharge device or tube 36. The R.F. amplifier input circuit is tuned to the predetermined channel frequency by the winding 28, and a tuning slug is provided adjacent the winding 28 to enable a precise adjustment of the inductance of the winding and hence the input circuit resonant frequency.

A neutralizing bridge circuit for the amplifier tube 36 is formed by the inherent grid-plate capacitance of the tube 36, inherent input capacitance of the tube 36, the capacitor 40 and the capacitor 38. The anode of the tube 36 is also connected to ground through a series resonant circuit 42 which is tuned to the television receiver I.F. The series resonant circuit 42 provides a low impedance path to ground to attenuate signals at the television receiver I.F. which might otherwise be conveyed through the R.F. amplifier to the receiver signal channel and interfere with the desired television signals. The cathode of the tube 36 is connected to the ground through a cathode biasing resistor 52 which is bypassed by a capacitor 54 having low impedance to VHF signals.

Automatic gain control (AGC) potentials which are derived in the television receiver signal channel as a function of the received signal strength, are applied to the grid of the tube 36 through a resistor 35 and a filtering capacitor 37.

The anode current of the tube 36 flows through an inductor 44 to the cathode of the grounded grid driven stage 46. The inductor 44 is effectively connected in series with the input capacitance of the tube 46, and is adjusted to resonant therewith somewhere in the passband of the driven grounded grid R.F. amplifier. The control grid of the tube 46 is connected to signal ground through a capacitor 48 which offers low impedance to radio frequency signals in the VHF television frequency band. A resistor 50 which is connected between the anode of the tube 36 and the control grid of the tube 46, provides a direct current return path from the control grid to the cathode of the tube 46. A second resistor 49 is connected from the grid of the tube 46 to a source of operating potential +B to provide a biasing circuit for the series connected tubes which enable a modified remote cut-off characteristic and balanced tube impedances. The biasing circuit includes the resistors 49 and 50 and the tube 36 and the desired remote cut-off characteristic is obtained by proper selection of the voltage divider ratio. This circuit enables optimum R.F. amplifier operation without necessitating a high AGC voltage or producing cross modulation.

The anode of the tube 46 is connected through an inductor 56 and a direct current dropping resistor 58 to the source of polarizing potential +B. The inductor 56 serves to prevent the power supply from loading the R.F. amplifier output circuit and to keep R.F. signals out of the power supply. A capacitor 60 is also provided as a bypass to ground for R.F. signals, and also aids in keeping these signals out of the power supply.

A blocking capacitor 62 connects the anode of the tube 46 with a stationary contact element 64 which engages a cooperating contact button 66 on the circuit strip.

The contact button 66 is connected through an R.F. amplifier output circuit winding 68 to another contact button 70 on the strip which engages a stationary grounded contact element 72. The inductor 68 tunes the amplifier 46 output circuit to resonant at the frequency of a selected television channel.

The output signals developed across the inductor 68 are fed through a small capacitor 74 to a parallel resonant circuit 76 which is tuned to the frequency of the selected television channel. The parallel resonant circuit 76 is connected to a crystal mixer 82 through a pair of contact buttons 78 on the circuit strip 24 and a cooperating pair of stationary contact elements 80.

A television receiver heterodyning signal is generated by a high-frequency oscillator 84. An inductor 88 is connected between the cathode of the oscillator tube and ground to maintain the cathode above signal ground and obtain more dependable oscillations operation, and a resistor 90 is connected between the control grid of the oscillator tube 84 and ground to provide a grid leak path between the cathode and control grid. The operating potential for the oscillator tube 84 is supplied through the direct current dropping resistor 81 and a serially connected inductor 83. The inductor 83 provides high impedance to R.F. signals and prevents the power supply from loading the oscillator tank circuit. Oscillator signals are bypassed to ground by a filter capacitor 85 to aid in keeping these signals out of the power supply.

The oscillator frequency determining tank circuit is connected between the anode and grid of the oscillator tube 84, and includes a capacitor 92 which supplements the inherent grid to anode capacitance of the tube 84 in parallel with the series combination of a fine tuning inductor 96 and a circuit strip inductor such as the winding 98. A blocking capacitor 94 is connected between the anode of the oscillator tube 84 and the fine tuning inductor 96 to keep the +B potential off the circuit strip 24.

The winding 98 is selected to resonant with the other oscillator tank circuit elements at a frequency which differs from the selected channel frequency by an amount equal to the television receiver I.F. A small capacitor 102 couples a predetermined amount of the oscillator signal energy to the tuned circuit 76 for mixing with the received channel signal energy in the signal mixer 82.

The received television signal energy, which in accordance wtih present standards includes an amplitude modulated picture carrier and a frequency modulated sound carrier located approximately 4.5 megacycles from the picture carrier is amplified by the driven grounded grid R.F. amplifier and heterodyned in the mixer 82 with the local oscillator signals to lower frequency sound and picture I.F. carriers located approximately 4.5 megacycles apart. The I.F. signal energy from the signal mixer 82 is developed across the primary winding of a transformer 104 which is tuned to the I.F. by inherent distributed and stray circuit capacities. The I.F. signals are then coupled to an I.F. amplifier 106 for amplification before being detected in a second detector 108. The second detector 108 is an amplitude demodulator which produces a video frequency output signal for each amplitude modulation sideband present at its input.

The frequency modulated sound I.F. signal appears to the detector merely as another sideband, varying slightly in frequency, and located approximately 4.5 megacycles from the picture I.F. carrier. Accordingly, the second detector 108 produces a 4.5 megacycle output signal, the beat frequency between the picture and sound I.F. carriers, commonly known as the intercarrier signal. The 4.5 megacycle intercarrier component arises from two carriers, one amplitude modulated, and the other frequency modulated. Consequently, the intercarrier signal is itself modulated in both amplitude and frequency. The deviation of its frequency modulation component is identical to that of the sound carrier, and this is true irrespective of the degree of amplitude modulation present on the picture carrier.

The output of the second detector is amplified by the video amplifier 110 and then conveyed to a trap circuit 112 to remove the sound intermediate frequency centered on 4.5 megacycles. The picture carrier is fed to the kineoscope 114, while the F.M. sound portion derived from the trap 112, is further amplified and limited in the amplifier limiter 116, detected in frequency demodulator 118 which by way of example may be a Seeley ratio detector, and amplified by the audio amplifier 120 before being fed to the loud speaker 122.

For the reception of ultra high-frequency signals the turret tuned may be moved or rotated to connect the tuning circuits on the strip 22 to the television input circuits. The antenna 10 which is also capable of intercepting UHF signals is connected through the antenna input terminals 12 and 13, the contact elements 32 and the contact buttons 30 to the UHF signal selection circuit which is mounted on the circuit strip 22.

The UHF signal selection circuit comprises a center tapped inductor 122 which is coupled to a parallel resonant circuit comprising an inductor 124 and a capacitor 130. The frequency of resonance of the signal selection circuit may be adjusted by varying the capacitance of the capacitor 130 which may be of the tubular type. The signal selection circuit is tuned to a frequency of a desired UHF signal and the energy developed therein is coupled through a pair of contact buttons 134 and contact elements 136 to the tube 46. One of the contact elements 136 is connected to ground while the other is connected to a D.C. blocking capacitor 138 to the cathode of the tube 146. The inductor 44 which is connected between the cathode of the tube 46 and the anode of the tube 36, provides a high impedance at UHF and serves to prevent the grounded cathode stage from loading the grounded grid stage. As noted above the inductor 44 provides tuning for VHF signals in the output circuit of the grounded cathode stage thereby serving a double function. This is another of the features which enables the low cost construction of the amplifier of the invention. In selecting the tube 46 care should be taken to select the tube which when connected for grounded grid operation will be suitable for UHF frequency amplification in the range between 460 and 890 megacycles.

UHF signals applied to the grounded grid stage 46 are amplified and fed through the contact elements 64 and 72 and the contact buttons 66 to a series resonant circuit comprising inductor 140 and a capacitor 141 on the strip 22 which are selected to tune the amplifier 46 output circuit to resonance at the frequency of a UHF television channel.

The output signals developed across the inductor 140 are coupled to a parallel resonant circuit 142 which is tuned to the frequency of the selected television channel. The parallel resonant circuit 142 is connected to the signal mixer 82 through a pair of contact buttons 144 on the circuit strip 22 and the cooperating contact elements 80. The oscillator tank circuit 146 on the UHF circuit strip is adjusted so that an oscillator signal of the proper frequency will be provided to heterodyne a received UHF signal to the television receiver intermediate frequency. For UHF reception, the fine tuning control 96 provides changes in capacity rather than in inductance as it does in the VHF range.

The heterodyned UHF signal is conveyed through the television receiver channel in the same manner as that described for VHF television signals.

In the operation of an R.F. amplifier structure constructed in accordance with the invention, a received VHF signal is applied to the grid of the grounded cathode stage 36 of the driven grounded grid amplifier and is amplified in the conventional manner. Automatic gain control potentials which are derived from the receiver signal channel and have an amplitude which is a function of the received signal strength is also applied to the grid of the grounded cathode stage 36.

Received UHF signals are connected with the cathode of the grounded grid stage 46 which operates as a conventional grounded grid amplifier for UHF signals. The AGC control potentials which are applied to the grounded cathode stage 36 then acts as a variable control on the plate voltage of the grounded grid stage 46 depending on the strength of the AGC potentials. The amplified signals for either VHF and UHF reception are developed in output circuits which are selectively connected with the anode of the tube 46. These signals are then fed to be television mixer circuit together with a locally generated oscillator signal for heterodyning to the television receiver intermediate frequency.

As has been noted above the tube which is used as the grounded grid amplifier should be specially selected to operate at UHF as well as VHF. Even if both stages of the driven grounded grid amplifier use tubes which were operable in the UHF driven range, the UHF signals could not be applied to the grounded cathode stage of the amplifier in the same manner as are VHF signals without complicated and expensive neutralizing and compensating circuitry, and even so the driven grounded stage tends to be unstable at UHF and breaks into oscillation. The VHF signals, however, could be applied to the input circuit of the grounded grid stage. This is undesirable since the grounded grid amplifier does not provide sufficient amplification at VHF to adequately mask the mixer noise so that the television receivers can meet competitive manufacturing specifications with regard to noise figure. Thus it is necessary to provide additional amplification for the VHF signals to reduce the noise figure of the receiver. This may be done as has been described above by the provision by a grounded cathode stage driving the grounded grid stage. The space current path of the two amplifier stages may be connected in series, or if desired, separate +B operating potential supply leads may be provided for each of the grounded cathode and grounded grid stages so that the space current paths are not in series. Alternatively, the additional amplification for VHF may be provided by a second grounded grid amplifier before the VHF signals are fed to the combination UHF-VHF grounded grid stage. The additional or second grounded grid amplifier which is operable only at VHF may use low cost tubes or the type presently being used for VHF amplification which are not necessarily stable at UHF.

In accordance with the invention an improved radio frequency signal amplifier for signals in two separate high-frequency bands has been provided which is efficient in operation and may be produced in large quantities at low cost. In its application to television receivers the amplifier provides the advantages of driven grounded grid operation for VHF signals while providing grounded grid amplification for UHF signals without additional tubes or circuitry than is ordinarily required for VHF amplification.

What is claimed is:

1. A high frequency amplifier for UHF and VHF television signals comprising in combination, a grounded cathode amplifier stage including an electron tube having at least an anode, a cathode, and a control grid, a grounded grid amplifier stage of a type suitable for effective amplification of UHF and VHF television signals and including an electron discharge device including at least an anode, a cathode, and a control grid, means including an inductor connected between the anode of said grounded cathode stage and the cathode of said grounded grid stage to connect the space current paths of said stages in series, said inductor being selected to be series resonant with the inherent input capacitance of said grounded grid stage in the VHF range, a first input circuit tunable to any one of a plurality of VHF signals connected with the control grid of the grounded cathode stage a second input circuit tunable to any one of a plurality of UHF signals connected with the cathode of said grounded grid stage, said inductor also being operable as an UHF choke to isolate said grounded grid stage from said grounded cathode stage for UHF reception, circuit means for connection with a source of VHF signals and a source of UHF signals, switching means selectively connecting said circuit means with said first input circuit or with said second input circuit, and output circuit means connected with the anode of said grounded grid stage.

2. A high frequency amplifier as defined in claim 1 wherein said output circuit includes a resonant circuit tunable to the frequency of the signal being amplified by said system.

3. A high frequency amplifier for UHF and VHF television signals comprising in combination a grounded cathode amplifier stage including an electron tube having at least an anode, a cathode, and a control grid, a grounded grid stage of a type suitable for effective amplification of UHF and VHF television signals and including an electron discharge device including at least an anode, a cathode, and a control grid, means including an inductor connected between the anode of said grounded cathode stage and the cathode of said grounded grid stage to connect the space current paths of said stages in series, said inductor being selected to be series resonant with the inherent input capacitance of said grounded grid stage in the VHF television band, a first tuned input circuit connected with the control grid of said grounded cathode stage for selecting VHF television signals a second input circuit tunable to any one of the plurality of UHF television signals connected to the cathode of said grounded grid stage, an antenna circuit for receiving UHF and VHF television signals, switching means for selectively connecting said antenna circuit with either the grid of said grounded cathode stage or the cathode of said grounded grid stage, said inductor also being operable as a UHF choke to isolate said grounded grid stage from said grounded cathode stage for UHF reception, and an output circuit for said amplifier connected with the anode of said grounded grid stage.

4. A high frequency amplifying system for signals in separate high frequency ranges comprising in combination, a first amplifier stage including an electron tube having at least an anode, a cathode, and a control grid, a second amplifier stage including an electron tube of a type suitable for effective amplification of UHF and VHF television signals and including at least an anode, a cathode, and a control grid, means providing a signal conveying connection from the anode of said first amplifier stage to the cathode of said second amplifier stage, said second amplifier stage connected to operate as a grounded grid amplifier, a first signal input circuit and a first signal output circuit selectively tunable to any one of a plurality of signals in the lower of said high frequency ranges, a second signal input circuit and a second signal output circuit selectively tunable to any one of a plurality of signals in the higher of said high frequency ranges, and switching means for selectively connecting said first input circuit with said first amplifier stage and said first signal output circuit to the anode of said second amplifier stage to amplify signals in the lower of said high frequency ranges, or for connecting said second input circuit with the cathode of said second amplifier stage and said second signal output circuit to the anode of said second amplifier stage to amplify signals in the higher of said frequency ranges.

5. A high frequency amplifier for UHF and VHF television signals as defined in claim 4 including means providing a source of gain control potential the amplitude of which is a function of the signal strength of a selected UHF or VHF signal, and means connected to apply said gain control potential to said grid of said grounded cathode stage.

References Cited in the file of this patent

UNITED STATES PATENTS

| | | |
|---|---|---|
| 2,673,254 | Eland | Mar. 23, 1954 |
| 2,763,733 | Coulter | Sept. 18, 1956 |
| 2,773,136 | Futterman | Dec. 4, 1956 |

OTHER REFERENCES

RCA Review, September 1953, pages 318–340, by T. Murakami (Fig. 14).